(12) United States Patent
Nakura et al.

(10) Patent No.: US 6,208,494 B1
(45) Date of Patent: Mar. 27, 2001

(54) SEMICONDUCTOR INTEGRATED CIRCUIT DEVICE INCLUDING ELECTROSTATIC PROTECTION CIRCUIT ACCOMMODATING DRIVE BY PLURALITY OF POWER SUPPLIES AND EFFECTIVELY REMOVING VARIOUS TYPES OF SURGE

(75) Inventors: Toru Nakura; Kimio Ueda, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/240,707

(22) Filed: Feb. 2, 1999

(30) Foreign Application Priority Data

Apr. 20, 1998 (JP) ................................. 10-109547
Aug. 26, 1998 (JP) ................................. 10-239928

(51) Int. Cl.[7] ....................................... H02H 9/00
(52) U.S. Cl. ......................... 361/56; 361/91.1; 361/111; 361/119
(58) Field of Search ............................. 361/56, 58, 91.1, 361/111, 117, 119, 118

(56) References Cited

U.S. PATENT DOCUMENTS 5,345,356 * 9/1994 Pianka ..................................... 361/56

FOREIGN PATENT DOCUMENTS

| | | | |
|---|---|---|---|
| 61-12043 | 1/1986 | (JP) | ............... H01L/21/82 |
| 61-292351 | 12/1986 | (JP) | ............... H01L/27/06 |
| 62-39045 | 2/1987 | (JP) | ............... H01L/27/06 |
| 2-28348 | 1/1990 | (JP) | ............... H01L/21/82 |
| 2-86317 | 3/1990 | (JP) | ............... H03K/19/003 |
| 5-102475 | 4/1993 | (JP) | ............... H01L/29/784 |
| 5-291503 | 11/1993 | (JP) | ............... H01L/23/60 |
| 6-177662 | 6/1994 | (JP) | ............... H03F/1/52 |
| 8-213555 | 8/1996 | (JP) | ............... H01L/27/04 |
| 9-162407 | 6/1997 | (JP) | ............... H01L/29/786 |

OTHER PUBLICATIONS

"A Quarter-micron SIMOX-CMOS LVTTL-compatible Gate Array with an Over 2,000 V ESD-protection circuit" by Ohtomo etal, IEEE 1996 Custom Integrated Circuits Conference, pp 4.3.1-4.3.4.

"NMOS Protection Circuitry", by Rountree et al., IEEE Transactions on Electron Devices, vol. ED-32, No. 5, May 1985, pp. 910-917.

"Design and Layout Requirements", by Amerasekera et al., ESD in Silicon Integrated Circuits (1995), pp. 70-71, 80-81.

* cited by examiner

Primary Examiner—Stephen W. Jackson
(74) Attorney, Agent, or Firm—McDermott, Will & Emery

(57) ABSTRACT

According to a structure in which each transistor of an output buffer transistor group of a gate array structure is electrically isolated, each body potential is set independent Also, a diode-connected transistor is provided between power supplies. An element not used in the output buffer transistor group can be connected without short-circuiting power supply lines between independent power supply lines to form an electrostatic protection circuit that is efficient in layout.

19 Claims, 12 Drawing Sheets

SEMICONDUCTOR INTEGRATED CIRCUIT DEVICE INCLUDING ELECTROSTATIC PROTECTION CIRCUIT ACCOMMODATING DRIVE BY PLURALITY OF POWER SUPPLIES AND EFFECTIVELY REMOVING VARIOUS TYPES OF SURGE

BACKGROUND OF THE INVENTION

1. Field of the Invention

The present invention relates to semiconductor integrated circuit devices, and more particularly, to a structure of a semiconductor integrated circuit device that can have efficient designing of an electrostatic protection circuit that protects internal elements from various types of surge generated between an input/output terminal and each power supply and between different power supplies when driven by a plurality of different power supplies.

2. Description of the Background Art

In accordance with increase in the speed of a semiconductor integrated circuit device, it has become necessary to increase the drive current of the output buffer of a semiconductor integrated circuit device.

Since the power supply potential of the power source for the output buffer circuit is apt to vary as the drive current is increased, measures must be taken to prevent erroneous operation of other internal circuits. In many cases, a power supply potential is provided to internal circuitry from a power source provided independent of the power source for the output buffer.

It is therefore necessary to achieve efficient designing of an electrostatic protection circuit corresponding to a plurality of power supplies.

FIG. 21 is a schematic diagram of a structure of a semiconductor integrated circuit device 6000 which is a semiconductor integrated circuit of the conventional master slice type gate array structure including an electrostatic protection circuit provided corresponding to a transistor group for an output buffer.

In the semiconductor integrated circuit device of FIG. 21, the output buffer formed of a group of transistors is supplied with a power supply potential for the output buffer (referred to as "Vdd1" hereinafter) and a ground potential (referred to as "Vss1" hereinafter) corresponding to Vdd1 through a Vdd1 power supply line (referred to as "Vdd1 line" hereinafter) 22 and a Vss1 power supply line (referred to as "Vss1 line" hereinafter) 23, respectively.

Electrostatic protection circuit 40 includes transistors 41 and 42.

Transistors 41 and 42 are connected between an input/output terminal 11 and Vdd1 line 22 and between input/output terminal 11 and Vss1 line 23, respectively, for the purpose employing a transistor not used in the group of transistors for the output buffer as a diode.

Transistor 41 functions as a PN diode having its gate connected to the region right under the gate (referred to as "body" hereinafter) and to either the source or drain (called "diode-connected" hereinafter) with the direction from input/output terminal 11 towards Vdd1 line 22 as the forward direction.

When a positive surge voltage that is referenced to Vdd1 line 22 is generated at input/output terminal 11, transistor 41 is turned on as a diode to remove the positive surge potential by the path from input/output terminal 11 to transistor 41 to Vdd1 line 22.

As a result, output buffer circuit 21 is protected from the positive surge voltage generated at input/output terminal 11.

Diode-connected transistor 42 functions as a PN diode with the direction from input/output terminal 11 to Vss1 line 23 as the reverse direction to protect output buffer 21 from the negative surge voltage that is referenced to Vss1 generated at input/output terminal 11.

A structure of an electrostatic protection circuit in which a plurality of internal circuits formed on the same substrate is operated by various independent power supply lines is disclosed in Japanese Patent Laying-Open No. 5-291503

FIG. 22 is a schematic diagram of an electrostatic protection circuit in a semiconductor integrated circuit device that operates by three independent power supply lines.

Referring to FIG. 22, a semiconductor integrated circuit device 7000 includes three internal circuits 301–303, and power supply lines 311–313 and ground lines 321–323 for supplying a power supply potential and a ground potential, respectively, to the above internal circuits, respectively.

Semiconductor integrated circuit device 7000 further includes diode pairs 341–346 connected between each of power supply lines 311–313 and between each of ground lines 321–323. Each diode pair (referred to as "bi-directional diode pair" hereinafter) includes two diodes connected parallel and opposite to each other. The technique of forming an electrostatic protection circuit between each of three independent power supply lines and ground lines by diode pairs 341–346 is disclosed.

In order to reduce the resistance of the electrode for the transistor included in a semiconductor integrated circuit device, the technique of covering the surface with a compound of metal and silicon called silicide is generally employed.

However, when an electrostatic protection circuit is formed by an unused diode-connected transistor as shown in FIG. 21 or 22, the resistance of the source/drain electrode of the transistor must be increased to a certain level so that the excessive current flowing through the electrostatic protection circuit will not damage the electrostatic protection circuit per se.

Thus, the silicide protection technique is employed to achieve an effect equal to that of applying resistance equivalently by providing a region where the silicide film is not formed at the electrode surface of the transistor.

When the transistor group for the output buffer has a gate array structure and driven by a plurality of independent power supply lines, the electrostatic protection circuit must be implemented to allow efficient designing of a higher degree of freedom with a smaller layout area using transistors formed of the same size.

The surge applied to the semiconductor integrated circuit device from an external source includes various types depending upon the generation status and generation source as is appreciated from the fact that various models such as HBM (Human Body Model), MM (Machine Model), CDM (Charged Device Model) and the like are considered as evaluation models.

Therefore, in the electrostatic production circuit functioning as a path to discharge the surge, the appropriate value of the resistance and the capacitance of the entire path including the parasitic parameter differs depending upon the type of the surge.

In conventional art, the region that is not silicided is designed in common to all the transistors in the application of the above-described silicide protection. This means that, even if the electrostatic production circuit is formed by connecting a plurality of transistors in parallel, the resistance value of the path to remove the surge is substantially identical. The electrostatic protection circuit may be appropriate to discharge surge of a certain type, but not appropriate for another type of surge. There was a problem that a sufficient electrostatic protection function could not be exhibited.

SUMMARY OF THE INVENTION

An object of the present invention is to provide a structure of a semiconductor integrated circuit device in which an electrostatic protection circuit with sufficient electrostatic breakdown resistance corresponding to a plurality of power supply lines can be realized by an efficient design of a high degree of freedom in a semiconductor integrated circuit device driven by a plurality of independent power supply lines and having a group of transistors for an output buffer formed in a gate array.

Another object of the present invention is to provide a structure of a semiconductor integrated circuit device in which an electrostatic protection circuit with sufficient electrostatic breakdown resistance corresponding to a plurality of power supply lines can be implemented by an efficient design of a high degree of freedom in a semiconductor integrated circuit device having a group of transistors forming an internal circuit in a gate array.

A further object of the present invention is to provide a structure of a semiconductor integrated circuit device including an electrostatic protection circuit that can form an effective removal path for various types of surge.

According to an aspect of the present invention, a semiconductor integrated circuit device formed on a semiconductor substrate includes input/output terminals, first to fourth power supply lines, a first transistor group, and a second transistor group.

A signal is input and output through the input/output terminal. The first and second power supply lines provide a first power supply potential. The third and fourth power supply lines provide a second power supply potential lower than the first power supply potential.

The first transistor group includes a plurality of transistors forming an internal circuit on a main surface of the semiconductor substrate, receiving power supply potential from the first and third power supply lines to carry out a predetermined process according to a signal applied to input/output terminals for providing a corresponding data signal. Each of the plurality of transistors of the first transistor group have the same transistor size.

The second transistor group includes a plurality of transistors formed on the main surface of the semiconductor substrate, and receiving power supply potential from the second and fourth power supply lines. Each of the plurality of transistors of the second transistor group has the same transistor size.

The second transistor group includes a first transistor subgroup, a second transistor subgroup, and a third transistor subgroup.

The first transistor subgroup forms an output buffer provided between the input/output terminals from which the data signal is output out of the input/output terminals and the internal circuit to apply a buffer process on the data signal.

The second transistor subgroup forms a first protection circuit protecting the output buffer and the internal circuit from a surge generated between the input/output terminals and one of the second and fourth power supply lines.

The third transistor subgroup forms a second protection circuit provided between the first power supply line and the second power supply line, and between the third power supply line and the fourth power supply line to protect the internal circuit from a surge generated between the input/output terminals and one of the first and third power supply lines.

According to another aspect of the present invention, a semiconductor integrated circuit device formed on a semiconductor substrate includes input/output terminals, first to fourth power supply lines, a first transistor group, and a second transistor group.

A signal is input and output through the input/output terminal. The first and second power supply lines provide a first power supply potential. The third and fourth power supply lines provide a second power supply potential lower than the first power supply potential.

The first transistor group includes a plurality of transistors forming an internal circuit on the main surface of the semiconductor substrate, receiving power supply potential from the first and third power supply lines to carry out a predetermined process according to a signal applied to the input/output terminal for providing a corresponding data signal.

The second transistor group includes a plurality of transistors formed on the main surface of the semiconductor substrate, receiving power supply potential from the second and fourth power supply lines. Each of the plurality of transistors of the second transistor group has the same transistor size.

The second transistor group includes a first transistor subgroup, a second transistor subgroup, and a third transistor subgroup.

The first transistor subgroup forms an output buffer provided between an input/output terminal from which the data signal is output out of the input/output terminals and the internal circuit to apply a buffer process on the data signal.

The second transistor subgroup forms a first protection circuit protecting the output buffer and the input buffer from a surge generated between the input/output terminal and one of the second and fourth power supply lines.

The third transistor subgroup forms a second protection circuit provided between the first power supply line and the second power supply line and between the third power supply line and the fourth power supply line for protecting the internal circuit from a surge generated between the input/output terminal and one of the first and third power supply lines.

According to still another aspect of the present invention, a semiconductor integrated circuit device formed on a semiconductor substrate includes first and second power supply lines, a plurality of input/output terminals, a transistor group, and an electrostatic protection circuit.

The first power supply line provides a first power supply potential. The second power supply line provides a second power supply potential lower than the first power supply potential.

The plurality of input/output terminals have a signal input/output.

The group of transistors is formed on a main surface of the semiconductor substrate, and receives a power supply potential from the first and second power supply lines. The transistor group is divided into a first plurality of subgroups.

The source and drain region of the transistor included in the first plurality of subgroups has an input resistance differing from every subgroup of the first plurality of subgroups.

The electrostatic protection circuit removes the surge generated between the input/output terminal and any of the first and second power supply lines.

The electrostatic protection circuit includes a first plurality of transistors belonging to each of the subgroups, connected parallel to each other between to the input/output terminal and the first power supply line, and a first plurality of transistors belonging to each of the subgroups, connected parallel to each other between the input/output terminal and the second power supply lines.

A main advantage of the present invention is that an electrostatic protection circuit corresponding to a plurality of independent power supplies can be implemented using a transistor from a group of transistors for the output buffer having a gate array structure. Therefore, the layout of a semiconductor integrated circuit device can be efficient with a high degree of freedom. Furthermore, the chip area can be reduced.

Another advantage of the present invention is that an electrostatic protection circuit that can have a surge removal path of different resistance values can be formed using an unused transistor. Therefore, various types of surge generated in the semiconductor integrated circuit device can be removed effectively.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
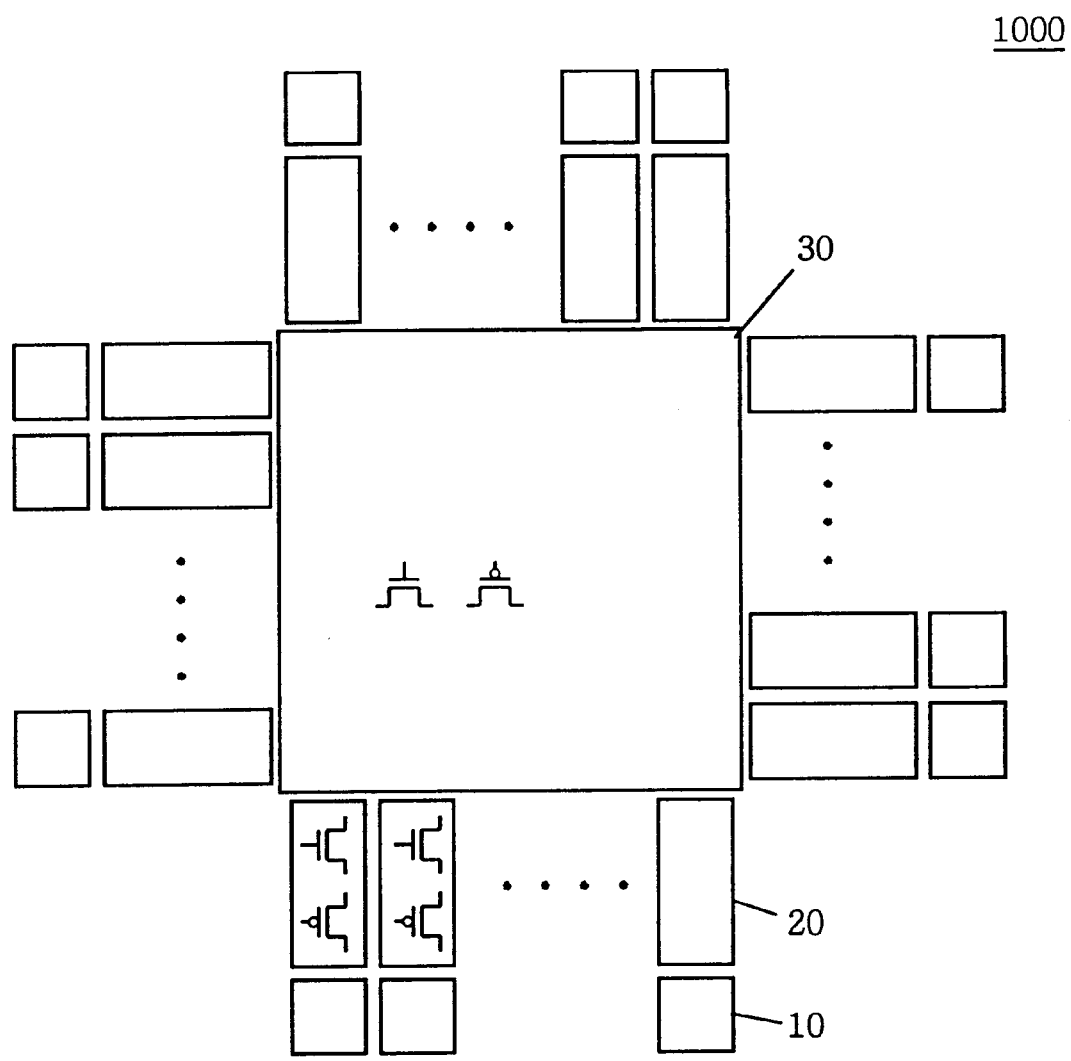
FIG. 1 is a schematic diagram showing a structure of a semiconductor integrated circuit device 1000 of a gate array structure.

FIG. 1 shows a structure of a semiconductor integrated circuit device 1000 of a gate array structure.

Referring to FIG. 1, semiconductor integrated circuit device 1000 includes a terminal group 10 connected to an external source to receive/transmit signals and potentials, a transistor group 20 for an output buffer to form an output buffer that applies a buffer process on an output signal, and a transistor group 30 for an internal circuit forming an internal circuit that carries out a predetermined process according to an input signal.

Terminal group 10 includes input/output terminals for transmitting and receiving a signal to and from an external source, and a power supply terminal to which an external power supply potential is applied.

Output buffer transistor group 20 includes a plurality of transistors to form an output buffer circuit. A plurality of transistors of the same size are installed beforehand for output buffer transistor group 20 to be used for any of an input buffer and an output buffer by modifying the pattern of the metal wiring. By the usage of the above-described master slice type gate array structure, a semiconductor integrated circuit device can be designed efficiently with a high degree of freedom.

Internal circuit transistor group 30 includes a plurality of transistors to form an internal circuit. It is to be noted that the transistors in internal circuit transistor group 30 do not have to be formed in the gate array system.

A problem is encountered in a semiconductor integrated circuit device driven by a plurality of independent power supply lines when the output buffer and the electrostatic protection circuit are formed according to a simple gate array system using output buffer transistor group 20 of FIG. 1. This problem is set forth in the following.

Figure 2:
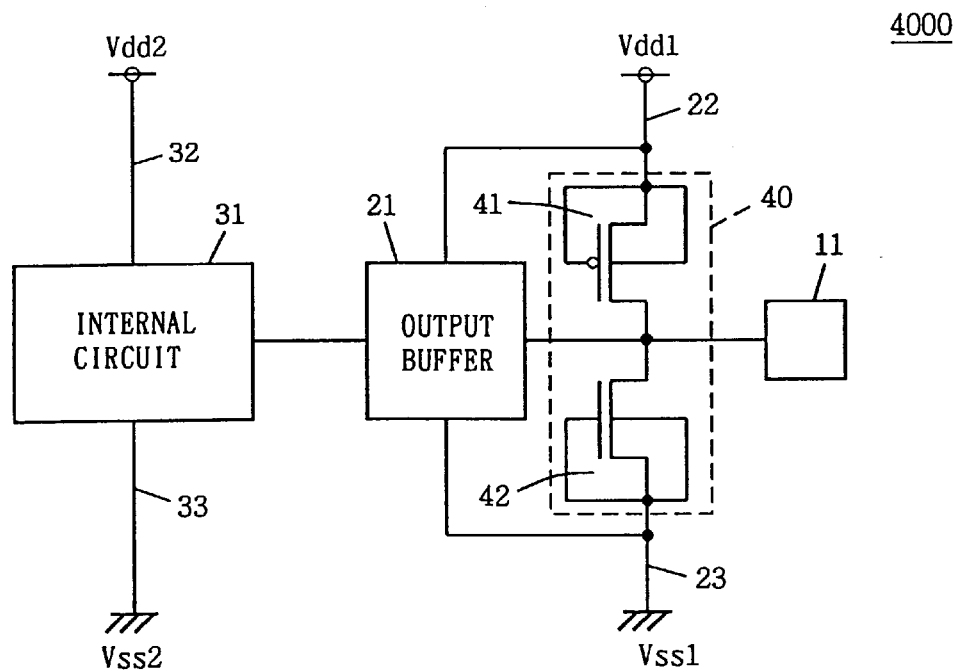
FIG. 2 is a schematic diagram of a semiconductor integrated circuit device 4000 in which an electrostatic protection circuit is applied to a gate array semiconductor integrated circuit device driven by a plurality of independent power supplies.
Figure 21:
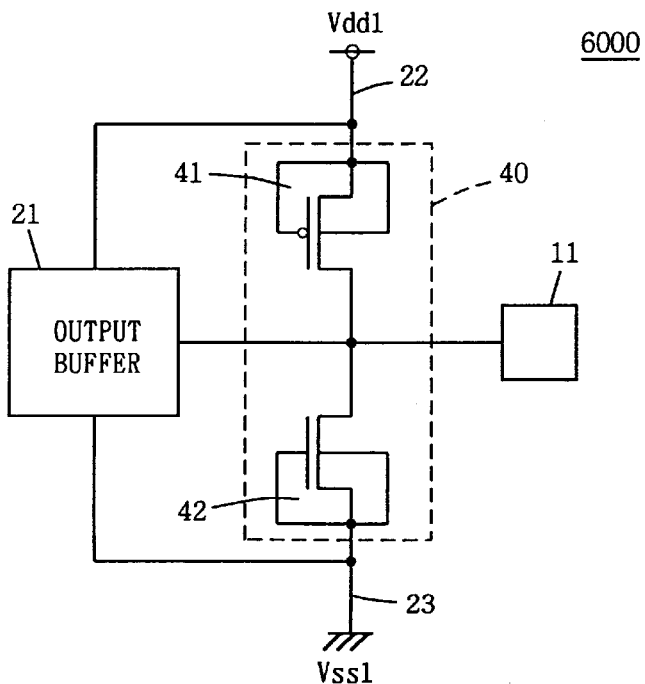
FIG. 21 is a schematic block diagram showing a structure of semiconductor integrated circuit device 6000 having a conventional protection circuit.
Figure 22:
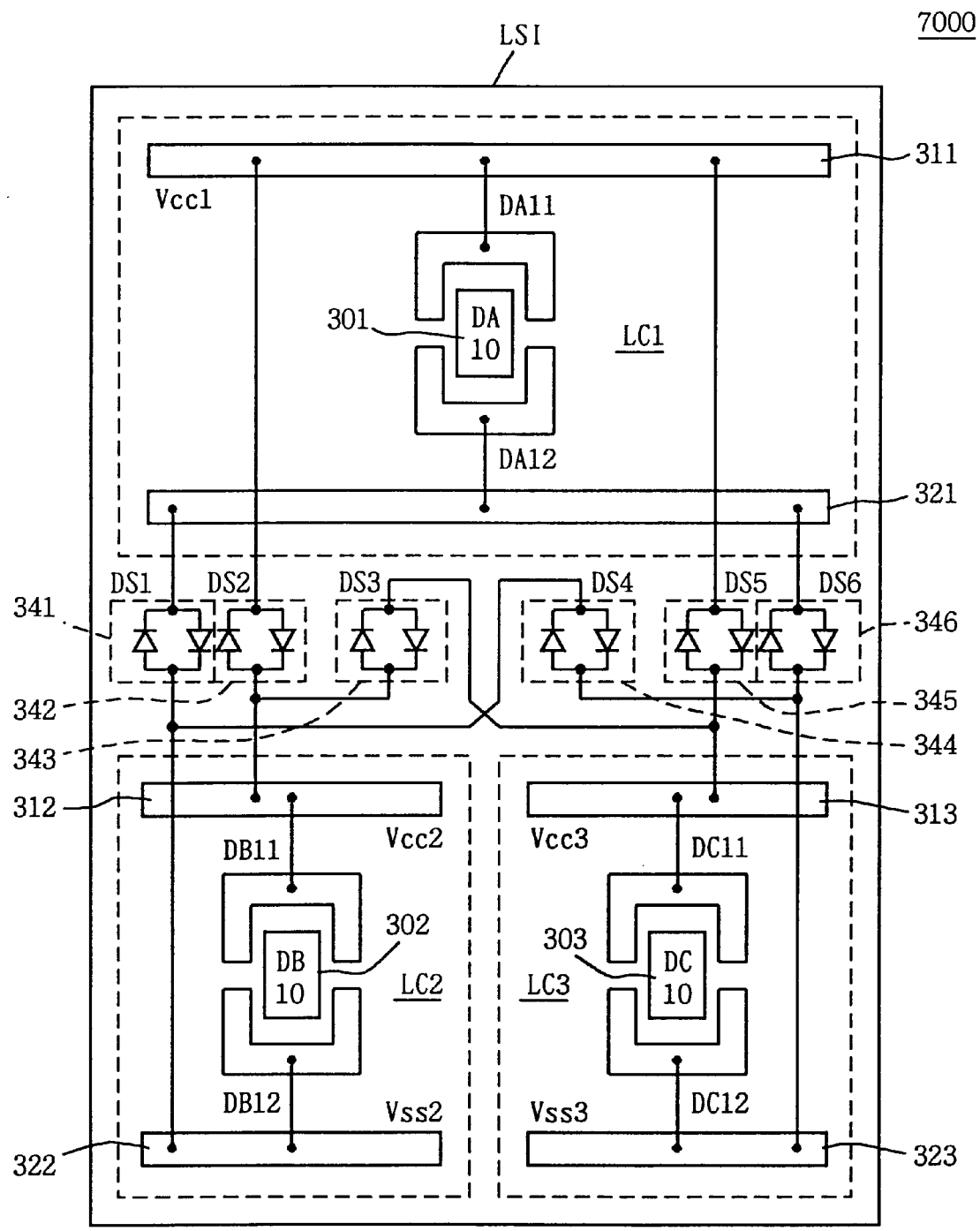
FIG. 22 is a schematic diagram showing a structure of a conventional semiconductor integrated circuit device 7000 having a protection circuit corresponding to a plurality of independent power supplies.

FIG. 2 shows a semiconductor integrated circuit device 4000 in which the electrostatic protection circuit of FIG. 21 is applied to a gate array semiconductor integrated circuit device driven by a plurality of independent power supply lines.

Semiconductor integrated circuit device 4000 includes, in addition to the elements of semiconductor integrated circuit device 6000, an internal circuit 31, an internal circuit power supply line 32 (referred to as "Vdd2 line" hereinafter) for providing an internal circuit power supply potential (referred to as "Vdd2" hereinafter) to internal circuit 31, independent to an output buffer power supply line 22 (referred to as "Vdd1 line" hereinafter), and an internal circuit ground line 33 (referred to as "Vss2 line" hereinafter) corresponding to Vdd2 line 32.

Electrostatic protection circuit 40 includes diode-connected transistors 41 and 42.

When a positive or negative surge voltage that is referenced to Vdd1 line 22 or Vss1 line 23 is generated at input/output terminal 11, electrostatic protection circuit 40 removes the surge voltage by an operation previously described with reference to FIG. 21. However, when a surge voltage that is referenced to Vdd2 line 32 and Vss2 line 33 which are other independent power supply lines, or when a surge voltage is generated at Vdd2 line 32 and Vss2 line 33, the surge voltage cannot be removed by only electrostatic protection circuit 40. This is because the path to remove such surge voltages cannot be established with diodes 41 and 42.

Figure 3:
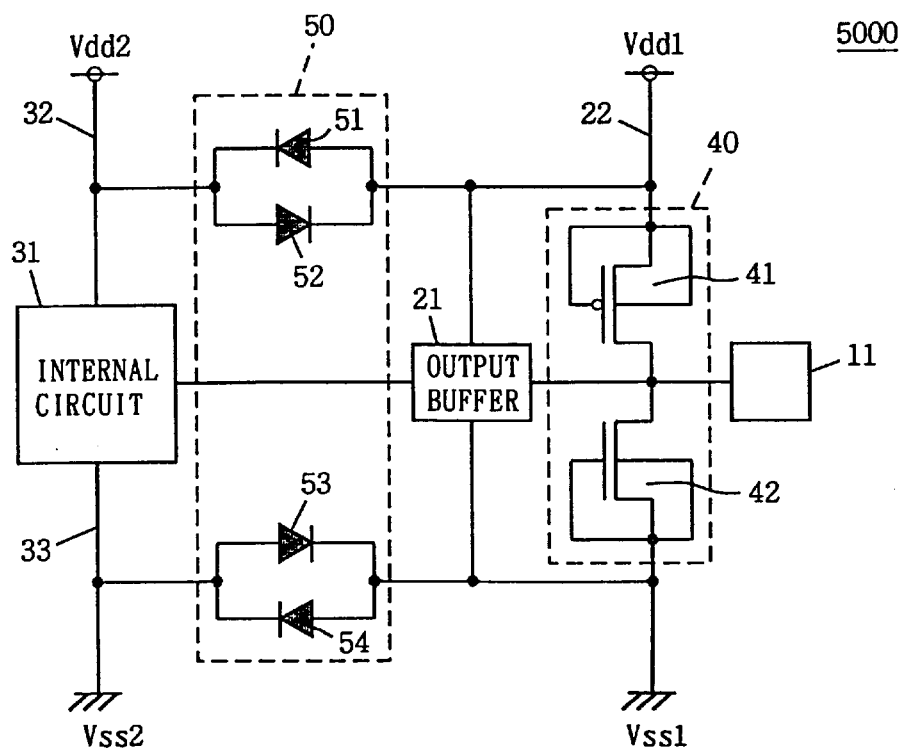
FIG. 3 is a schematic diagram of a semiconductor integrated circuit device 5000 in which an electrostatic protection circuit is applied to a gate array semiconductor integrated circuit device driven by a plurality of independent power supplies.

FIG. 3 is a schematic block diagram showing a structure of a semiconductor integrated circuit device 5000 in which the concept of forming an electrostatic protection circuit by connecting a pair of bi-directional diodes across independent power supply lines disclosed in Japanese Patent Laying-Open No. 5-291503 is incorporated into semiconductor integrated circuit device 4000. Semiconductor integrated circuit device 5000 accommodates the above problem.

Referring to FIG. 3, semiconductor integrated circuit device 5000 includes an electrostatic protection circuit 50 connected between Vdd1 line 22 and Vdd2 line 32 supplying power supply potential and ground potential independently, and between Vss1 line 23 and Vss2 line 33.

Electrostatic protection circuit 50 includes diodes 51, 52 and 53, 54 forming bi-directional diode pairs. Electrostatic protection circuit 50 protects internal circuit 31 and output buffer 21 from the surge voltage generated corresponding to the plurality of independent power supply lines.

In electrostatic protection circuit 50, diode 52 provides the positive surge voltage generated at Vdd2 line 32 to Vdd1 line 22 for removal. Diode 51 provides the negative surge voltage generated at Vdd2 line 32 to Vdd1 line 31 and removes the positive surge voltage that is referenced to Vdd2 generated at input/output terminal 11 through the path of input/output terminal 11—transistor 41—diode 51—Vdd2 line 32.

By a similar operation, the pair of diodes 53 and 54 remove the surge voltage generated at Vss2 line 33 and the negative surge voltage that is referenced to Vss2 generated at input/output terminal 11.

Figure 4:
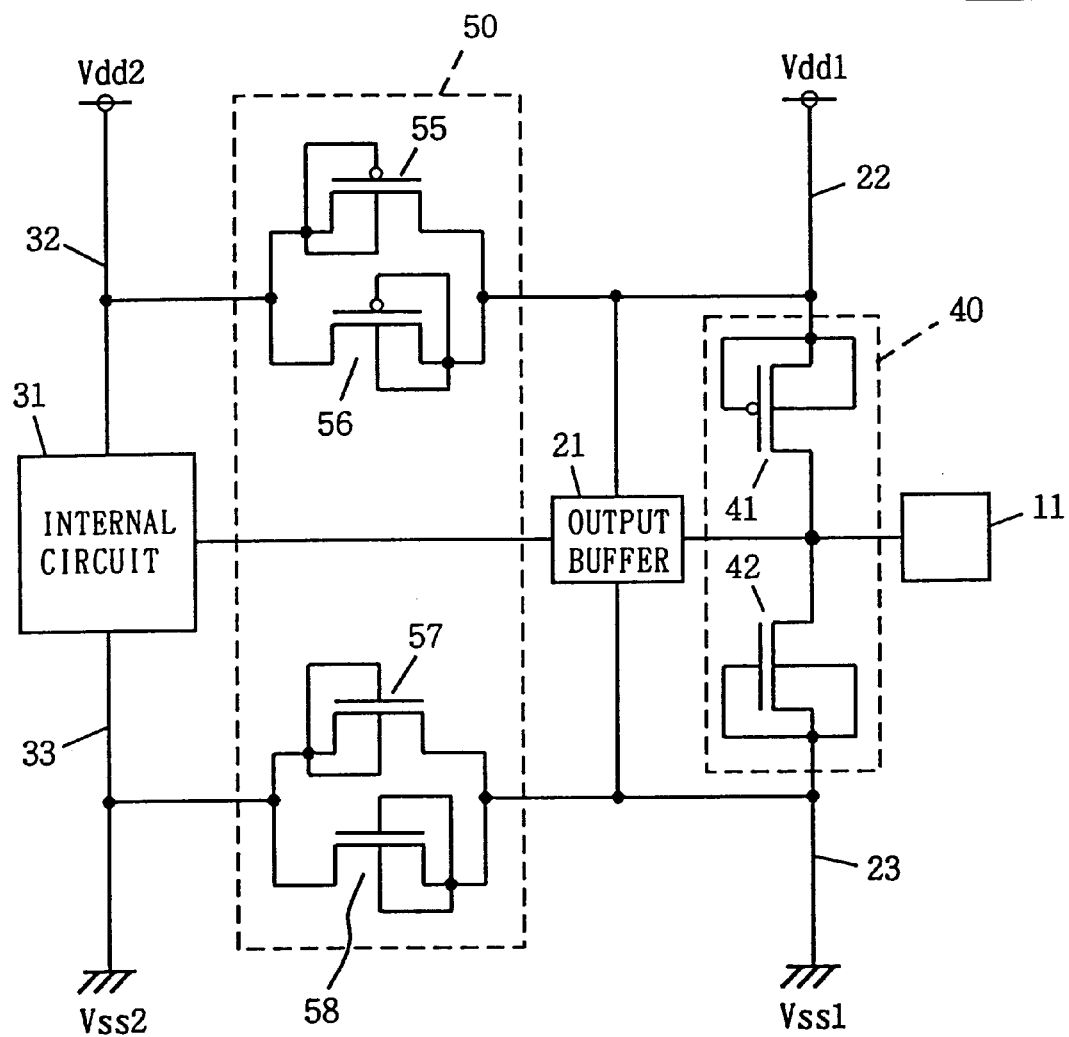
FIG. 4 is a schematic block diagram showing a structure of a semiconductor integrated circuit device 2000 according to a first embodiment of the present invention.

FIG. 4 is a schematic block diagram of a semiconductor integrated circuit device 2000 according to the first embodiment of the present invention in which the above-described bi-directional diode pairs 51, 52 and 53, 54 are formed by diode-connected transistors.

Referring to FIG. 4, transistors 55–58 function as a diode by having each gate, body, and one of the source and drain connected to attain the same potential, and form electrostatic protection circuit 50.

If transistors not used in the same gate array can be employed as transistors 55–58 forming the bi-directional diode pairs, effective designing can be realized.

However, transistors 55–58 could not be used as arbitrary transistors due to layout restriction as set forth in the following. It was not possible to achieve effective layout designing.

Figure 5:
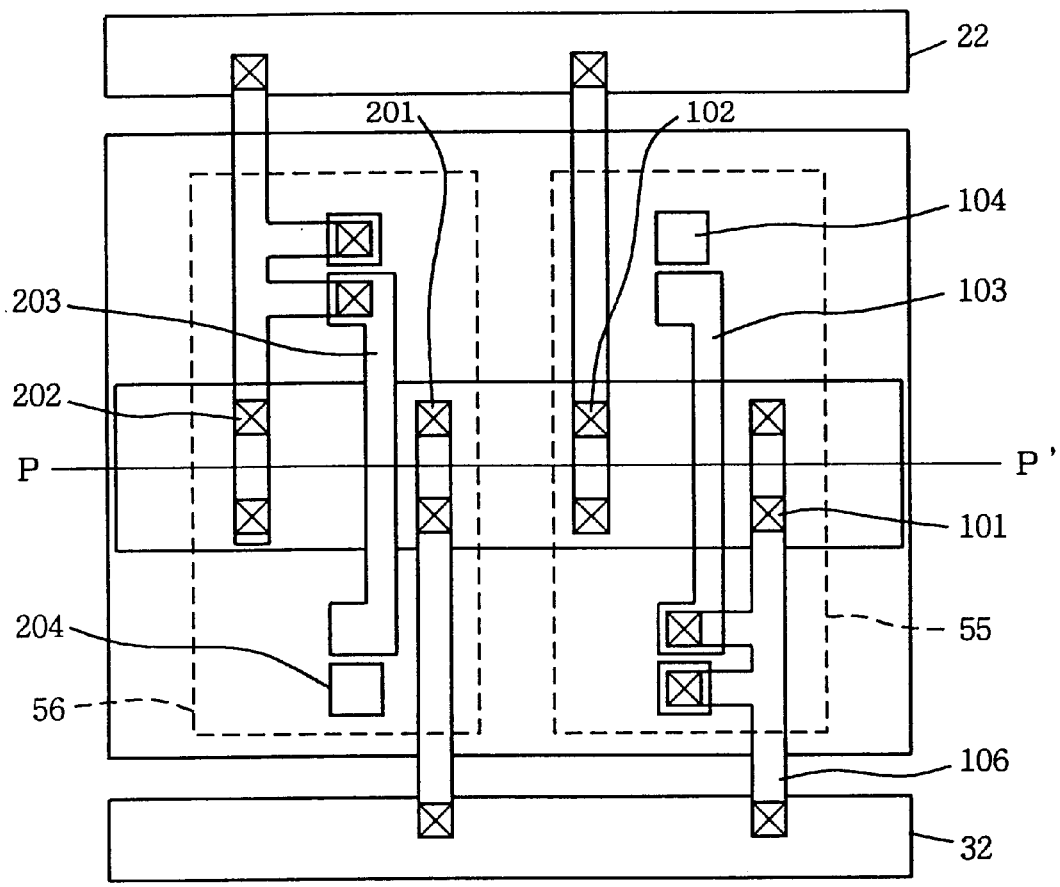
FIG. 5 is a plan view of the layout of an electrostatic protection circuit 50 of FIG. 4.

FIG. 5 is a plan view showing the layout of electrostatic protection circuit 50 of semiconductor integrated circuit device 2000 of FIG. 4.

Figure 6:
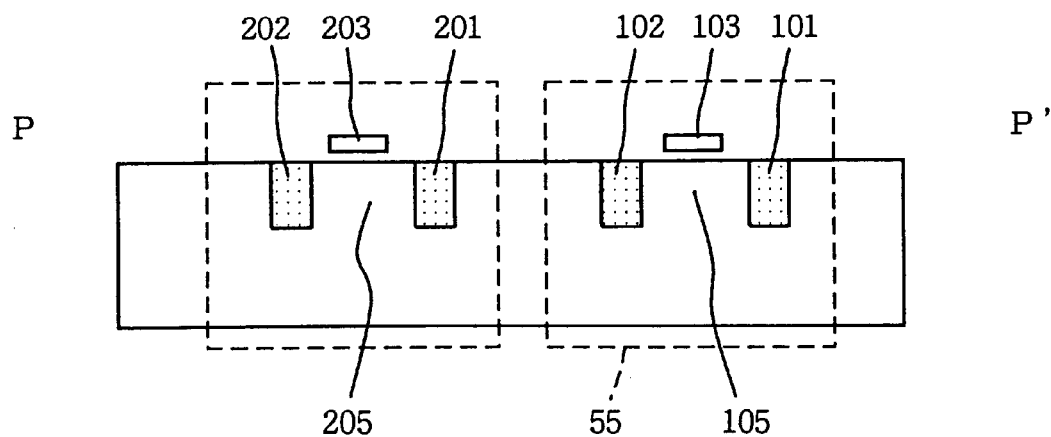
FIG. 6 is a sectional view of electrostatic protection circuit 50 of FIG. 4 taken along line P–P'.

FIG. 6 is a schematic diagram of FIG. 5 taken along P–P'.

In FIG. 5, transistors 55 and 56 operating as a bi-directional diode pair in FIG. 4 are formed in the same well.

Transistor 55 has its body 105 connected to Vdd2 line 32 via a body contact 104. Similarly, transistor 56 has its body 205 connected to Vdd1 line 22 via a body contact 204.

As shown in FIG. 6, body 105 of transistor 55 and body 205 of transistor 56 are provided in a common region. Therefore, their potentials are equal.

This means that a path that short-circuits Vdd1 line 22 and Vdd2 line 32 through the bodies of the two transistors will be formed.

Therefore, the bi-directional diode pair must be designed to be provided at different regions in the area for the electrostatic protection circuit within the semiconductor circuit device. For example, when the bi-directional diode pair is to be designed for semiconductor integrated circuit device 1000 of FIG. 1, a region is additionally required to form the bi-directional diode pair in addition to the region for terminal group 10, output buffer transistor group 20, and internal circuit transistor group 30. It is therefore not possible to provide designing efficiently of a high degree of freedom.

Figure 7:
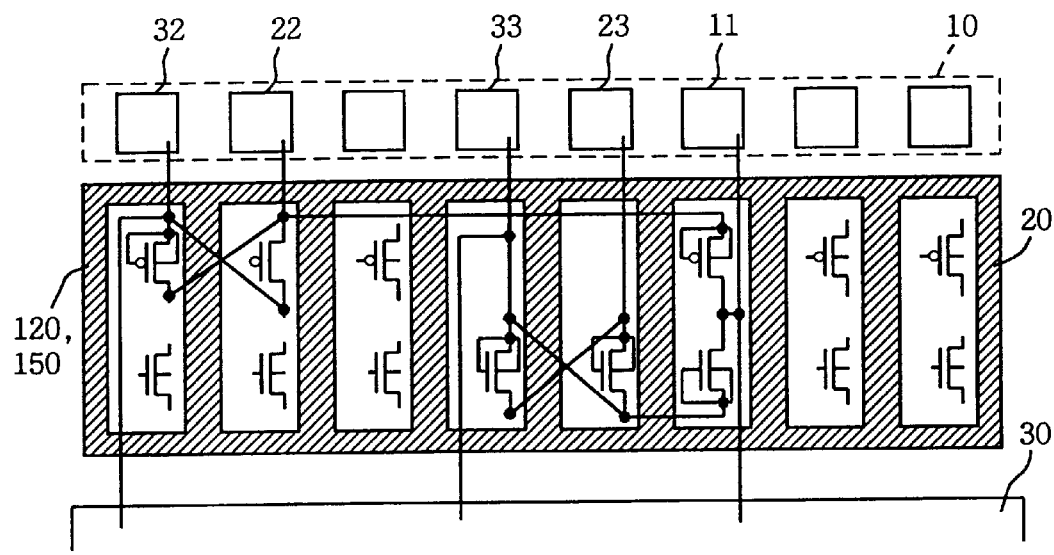
FIG. 7 is a schematic diagram showing a partial enlargement of a transistor group for an output buffer of a semiconductor integrated circuit device 1000.

FIG. 7 is a schematic diagram showing an enlargement of transistor group 20 corresponding to an output buffer of semiconductor integrated circuit device 1000 of FIG. 1.

Referring to FIG. 7, terminal group 10 includes input/output terminal 11, and power supply terminals for providing a power supply potential to respective Vdd1 line 21, Vss1 line 22, Vdd2 line 32 and Vss2 line 33.

Output buffer transistor group 20 includes transistors forming the output buffer and the above-described electrostatic protection circuits 40 and 50.

Since each transistor included in output buffer transistor group 20 of semiconductor integrated circuit device 1000 is designed to be electrically isolated, the body potential of each transistor can be controlled independently. Therefore, electrostatic protection circuits 40 and 50 are arranged within the same output buffer transistor group 20 without inducing short-circuit between the power supply lines.

Internal circuit transistor group 30 includes an internal circuit, which is protected from the surge voltage generated at input/output terminal 11 and each of power supply lines 22, 23, 32, and 33 by electrostatic protection circuits 40 and 50.

Electrostatic protection circuit 50 can be designed using the elements not used in output buffer transistor group 20. Therefore, the electrostatic protection circuit for protecting the internal circuit from the surge voltage generated by a plurality of independent power supply lines can be realized on the basis of an effective layout of a high degree of freedom in a semiconductor integrated circuit device that includes an output buffer transistor group 20 of a gate array.

Figure 8:
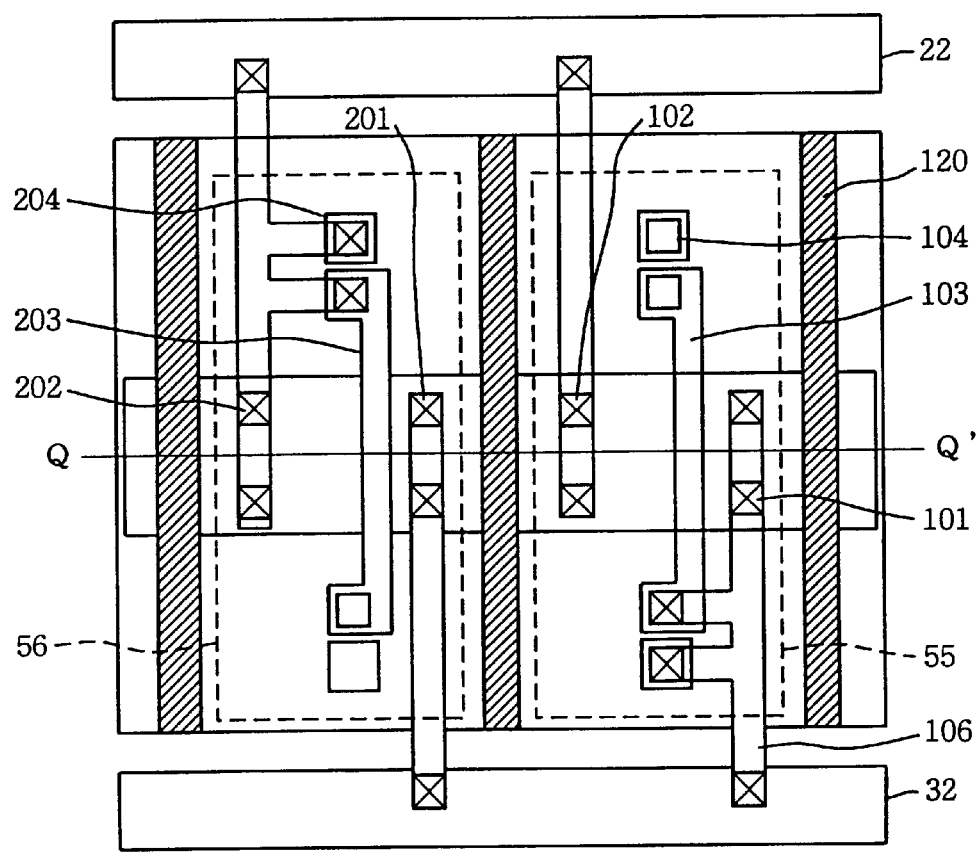
FIG. 8 is a plan view of the layout of a semiconductor integrated circuit device 2000 realized on a semiconductor substrate of an SOI (Silicon on Insulator) structure.

FIG. 8 is a plan view showing the layout in which the structure where each transistor of output buffer transistor group 20 is electrically isolated is formed on a semiconductor substrate of an SOI (Silicon on Insulator) structure.

Referring to FIG. 8, transistors 55 and 56 are formed on a semiconductor substrate. Transistor 55 includes source/drain 101 and 102, a gate 103, and a terminal of a body contact 104 electrically connected to body 105.

Transistor 56 includes source/drain 201 and 202, a gate 203, and a terminal of a body contact 204 electrically connected to body 205.

Transistors 55 and 56 are completely isolated from each other by an oxide film 120.

Figure 9:
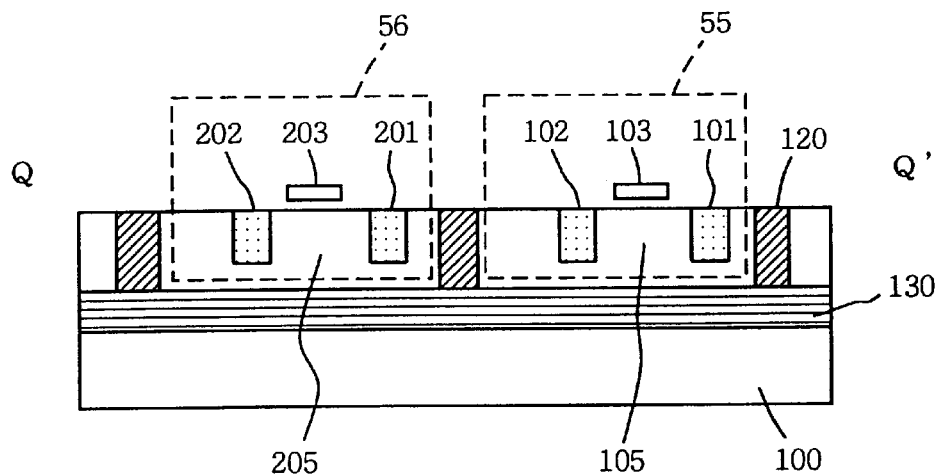
FIG. 9 is a sectional view of the structure of FIG. 8 taken along line Q–Q'.
Figure 10:
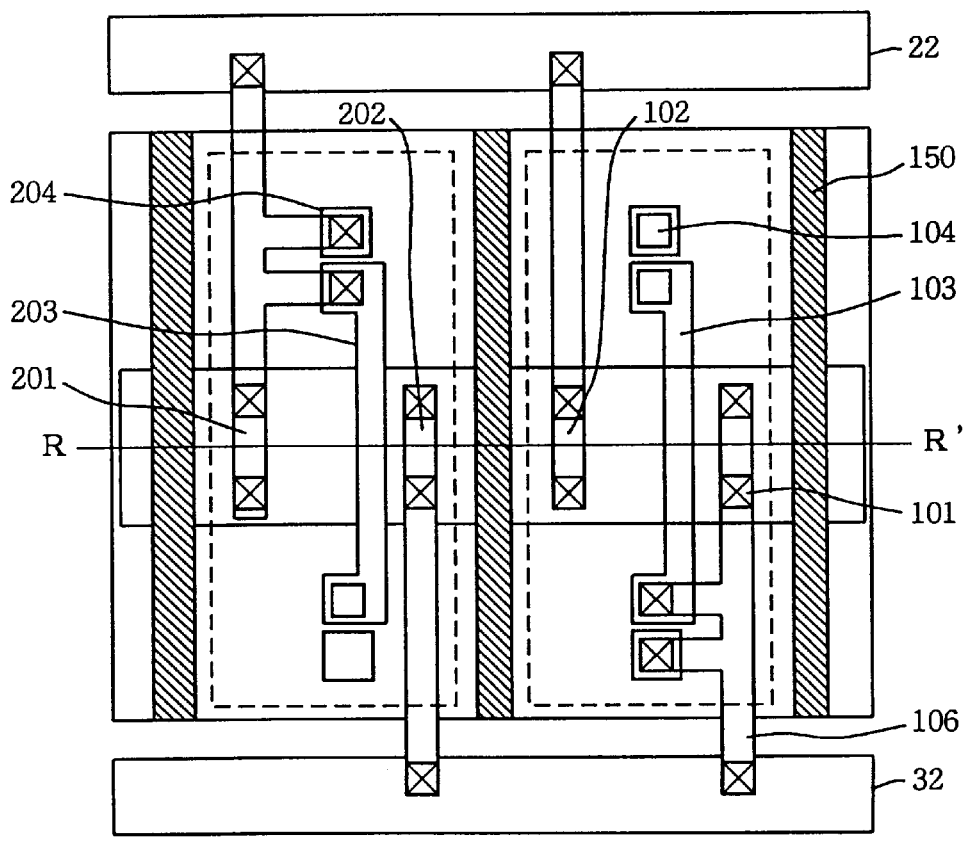
FIG. 10 is a plan view of the layout of semiconductor integrated circuit device 2000 realized on a semiconductor substrate of a bulk structure.

FIG. 9 is a schematic diagram showing a structure of FIG. 10 taken along line Q–Q'.

Referring to FIG. 9, body 105 of transistor 55 which is a P type transistor and body 205 of transistor 56 are formed at an N type semiconductor layer 110 at the main surface.

Transistors 55 and 56 are electrically isolated by an insulation layer 130 provided between semiconductor layer 100 of the substrate and N type semiconductor layer 110, and by oxide film 120 for complete isolation located from the main surface to insulation layer 130. Therefore, bodies 105 and 205 of the two transistors can be controlled with independent potentials.

Therefore, a path that short-circuits Vdd1 line 22 and Vdd2 line 23 that are independent power supply lines will not be formed even when transistors 55 and 56 are connected between Vdd1 line 22 and Vdd2 line 23 as a bi-directional diode pair.

By the above-described designing of output buffer transistor group 20 of a gate array, semiconductor integrated circuit device 1000 formed on a semiconductor substrate of an SOI structure can have an electrostatic protection circuit for protecting the internal circuit from the surge voltage generated by a plurality of independent power supply lines be realized on the basis of an effective layout of a high degree of freedom.

Transistors 57 and 58 which are N type transistors have each body formed at a P type semiconductor layer. According to the above-described means, each transistor of output buffer transistor group 20 can be electrically isolated to obtain a similar effect as described above.

FIG. 10 is a plan view showing the layout of a structure in which each transistor of output buffer transistor group 20 is electrically isolated is formed on a semiconductor substrate of a bulk structure. Referring to FIG. 10, transistors 55 and 56 are formed on a semiconductor substrate. Transistor 55 includes source/drain 102, gate 103, and a terminal of body contact 104 electrically connected to body 105.

Transistors 56 includes source/drain 202, gate 203, and a terminal of body contact 204 electrically connected to body 205.

Figure 11:
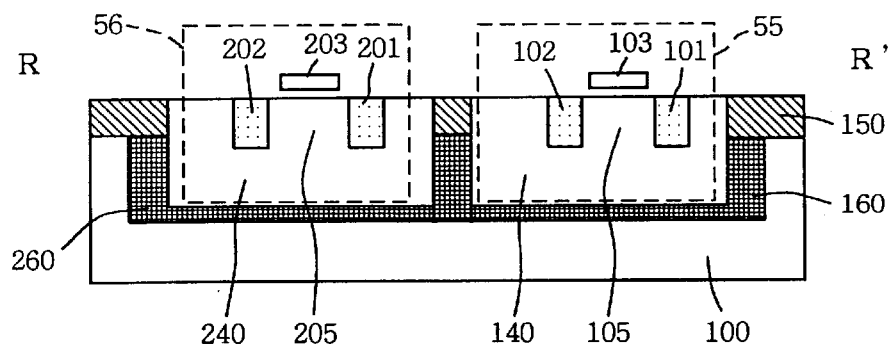
FIG. 11 is a sectional view showing a structure of FIG. 10 taken along line R–R'.

FIG. 11 shows a structure of FIG. 10 taken along line R–R'.

Referring to FIG. 11, transistors 55 and 56 which are P type transistors have their bodies 105 and 205 formed at first wells 140 and 240 which are of the N type. Second wells 160 and 260 which are of the P type formed surrounding first wells 140 and 240 electrically isolate first wells 140 and 240.

The bodies of transistors 55 and 56 are electrically isolated from each other by isolating second wells 160 and 260 with a LOCOS oxide film 150.

Therefore, a path that short-circuits Vdd1 line 22 and Vdd2 line 23 that are independent power supply lines will not be formed by virtue of LOCOS oxide film 150 even when transistors 55 and 56 are connected between Vdd1 line 22 and Vdd2 line 23 as a bi-directional diode pair.

By the above-described structure of output buffer transistor group 20 of a gate array, semiconductor integrated circuit device 1000 formed on a semiconductor substrate of a bulk structure can have an electrostatic protection circuit protecting the internal circuit from surge voltage generated by a plurality of independent power supply lines realized on the basis of an effective layout of a high degree of freedom.

Transistors 57 and 58 which are N type transistors have their bodies 105 and 205 formed at a P type semiconductor layer. By similar means, each transistor of output buffer transistor group 20 can be electrically isolated. Accordingly, an advantage similar to that described above can be obtained.

In the first embodiment, electrostatic protection circuit 50 is indicated to have a structure including bi-directional diode pairs as a desirable structure. When the surge voltage is significantly great, a path removing the surge voltage generated in the reverse direction of the diode can be ensured even by a single diode to obtain the same effect.

Second Embodiment

Figure 12:
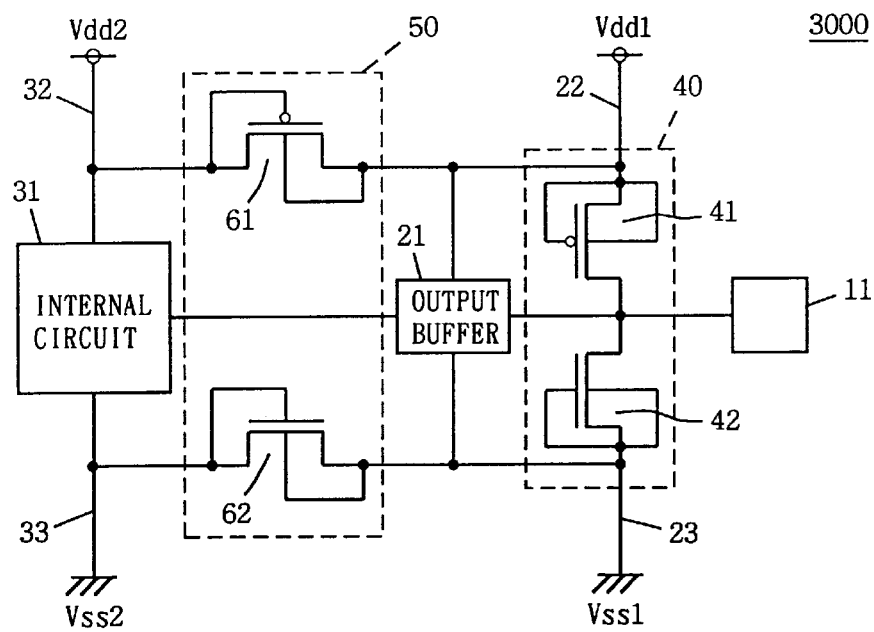
FIG. 12 is a schematic block diagram showing a structure of a semiconductor integrated circuit device 3000 according to a second embodiment of the present invention.

FIG. 12 is a schematic block diagram of a semiconductor integrated circuit device 3000 according to a second embodiment of the present invention. Semiconductor integrated circuit device 3000 has a structure in which bi-directional diode pairs 51, 52 and 53, 54 of semiconductor integrated circuit device 5000 in FIG. 3 are formed by connection of a single transistor.

In semiconductor integrated circuit device 3000 of FIG. 12, electrostatic protection circuit 50 includes a transistor 61 instead of bi-directional diode pair 51 and 52, and a transistor 62 instead of bi-directional diode pair 53 and 54 of semiconductor integrated circuit device 5000.

The function of electrostatic protection circuit 50 is identical to that in semiconductor integrated circuit device 5000.

Figure 13:
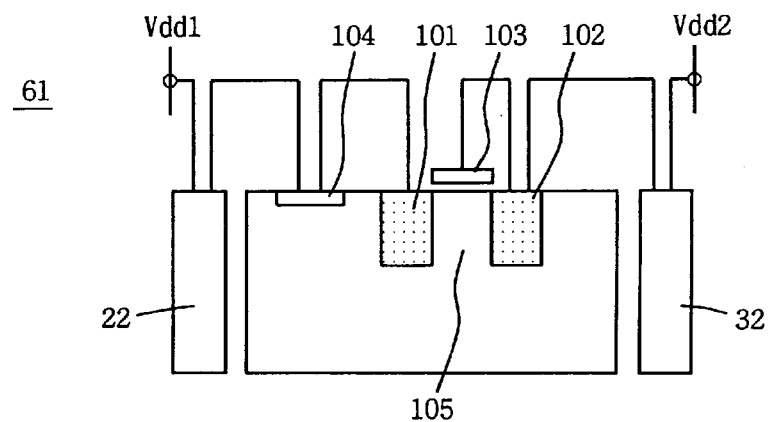
FIGS. 13 and 14 are schematic diagrams for describing a structure of a transistor 61 and a transistor 62, respectively, of FIG. 12.
Figure 14:
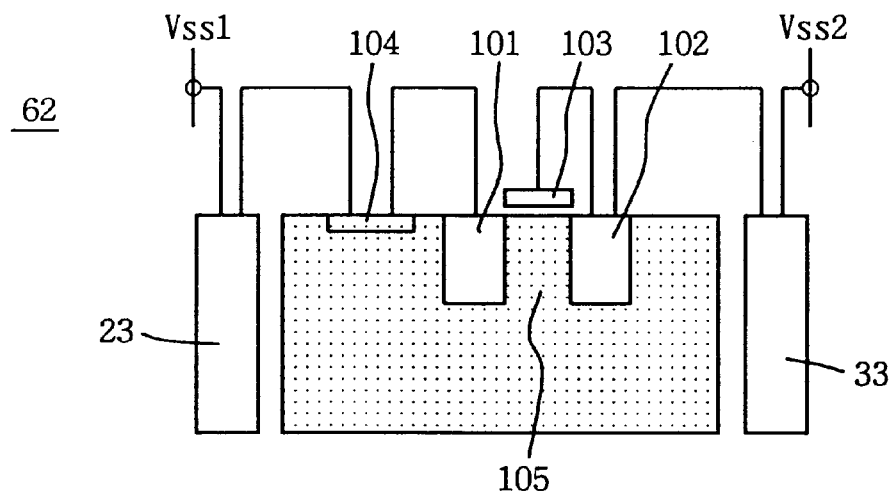

FIGS. 13 and 14 are schematic diagrams for indicating the structure of transistors 61 and 62, respectively.

First, the operation of transistor 61 as a bi-directional diode pair will be described.

Referring to FIG. 13, P type transistor 61 includes source/drain 101 connected to body contact 104, and source/drain 102 connected to gate 103. Gate 103 is connected to Vdd2 line 32, and body contact 104 is connected to Vdd1 line 22.

The operation of P type transistor 61 when a surge voltage is generated at Vdd1 line 22 or Vdd2 line 32 will be described hereinafter.

(a) When a positive surge voltage is generated at Vdd1 line 22, source/drain 101 connected to Vdd1 line 22 functions as a source. Gate potential Vdd2 becomes a low potential with respect to the source. Therefore, P type transistor 61 conducts. As a result, the positive surge voltage is removed by the path of Vdd1 line 22—source/drain 101—body 105—source/drain 102—Vdd2 line 32.

(b) When a negative surge voltage is generated at Vdd1 line 22, the PN junction diode formed by N type body 105 connected to Vdd1 line 22 via body contact 104 and P type source/drain 102 connected to Vdd2 line 32 is forward-biased to conduct. Therefore, the negative surge voltage is removed by the path of Vdd1 line 22—body 105—source/drain 102—Vdd2 line 32.

(c) When a positive surge voltage is generated at Vdd2 line 32, a PN junction diode formed between P type source/drain terminal 102 connected to Vdd2 line 32 and N type body 105 is forward-biased to conduct. As a result, the positive surge voltage is removed by the path of Vdd2 line 32—source/drain 102—body 105—Vdd1 line 22.

(d) When a negative surge voltage is generated at Vdd2 line 32, source/drain 101 connected to Vdd1 line 22 functions as a source, so that potential Vdd2 of gate 103 is low with respect to the source. Therefore, P type transistor 61 conducts. Thus, the positive surge voltage is removed by the path of Vdd2 line 32—source/drain 102—body 105—source/drain 101—Vdd1 line 22.

As described above, P type transistor 61 is connected between Vdd1 line 22 and Vdd2 line 32 to operate as a bi-directional diode pair. A function identical to that of transistor pair 55 and 56 of semiconductor integrated circuit device 2000 is achieved.

Similarly, N type transistor 62 shown in FIG. 14 carries out a similar operation provided that the polarity is opposite to that of P type transistor 61 of FIG. 13. N type transistor 62 functions as a bi-directional diode pair to provide an advantage identical to that of the pair of transistors 57 and 58 of semiconductor integrated circuit device 2000.

Transistors 61 and 62 have their bodies connected to Vdd1 line 22 and Vss1 line 23 so that the body potentials attain the level of Vdd1 and Vss1, respectively, which is the power supply potential common to output buffer transistor group 20.

Even when each transistor of output buffer transistor group 20 is not designed so as to be electrically isolated as described in the first embodiment, the transistor of output buffer transistor group 20 can be employed as transistors 61 and 62 in electrostatic protection circuit 50.

In semiconductor integrated circuit device 3000, transistor 61 can operate as a bi-directional diode pair through a structure in which transistor 61 has its body connected to Vdd2 line 32 and its gate connected to Vdd1 line 22.

Similarly, transistor 62 can operate as a bi-directional diode pair through a structure in which transistor 62 has its body connected to Vss2 line 33 and its gate connected to Vss1 line 23.

Figure 15:
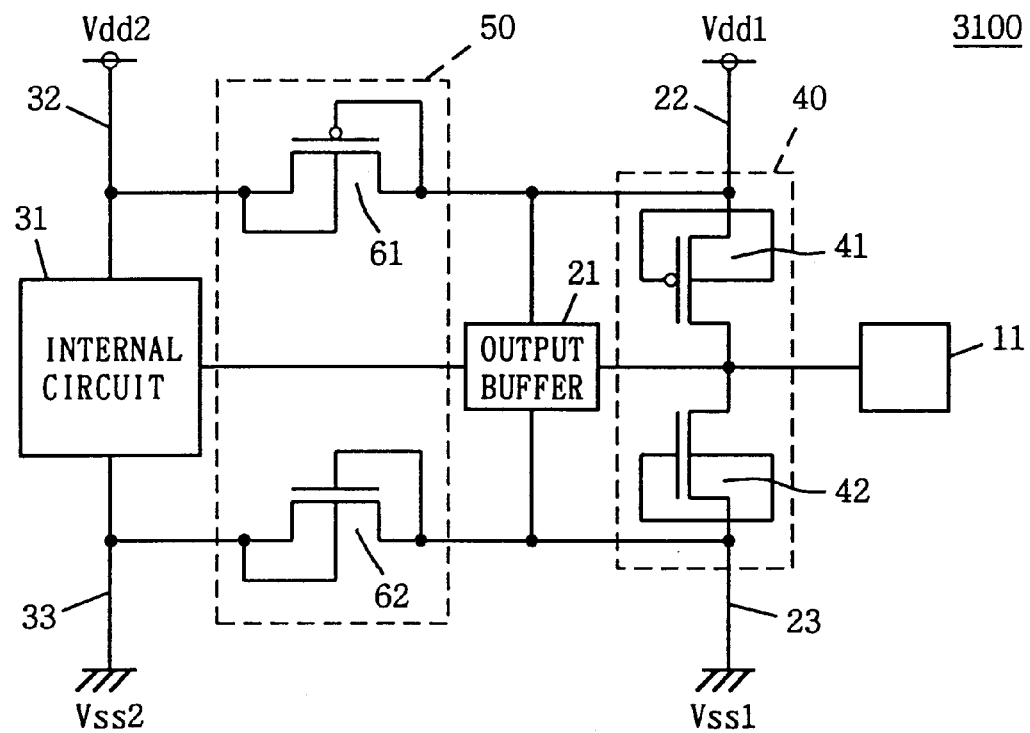
FIG. 15 is a schematic block diagram showing a structure of a semiconductor integrated circuit device 3100 according to a modification of the second embodiment of the present invention.

FIG. 15 is a schematic block diagram showing a structure of a semiconductor integrated circuit device 3100 of the above-described connection. In semiconductor integrated circuit device 3100, transistor 61 forming electrostatic protection circuit 50 has its body connected to Vdd2 line 32 whereas transistor 41 forming electrostatic protection circuit 40 has its body connected to Vdd1 line 22.

Therefore, if transistors 41 and 61 are designed to be provided on the same region that is not electrically isolated, a path is generated that short-circuits Vdd1 line 22 and Vdd2 line 32 through the bodies of the two transistors. It is therefore necessary to electrically isolate each transistor in output buffer transistor group 20 by the means described in the first embodiment when electrostatic protection circuits 40 and 50 of semiconductor integrated circuit device 3100 are implemented using the transistors of output buffer transistor group 20.

The structure of semiconductor integrated circuit devices 3000 and 3100 can be realized on the basis of an effective layout of a high degree of freedom by an electrostatic protection circuit for protecting the internal circuit from a surge voltage generated by a plurality of independent power supply lines with transistors half in number than that of the first embodiment in a semiconductor integrated circuit device including an output buffer transistor group 20 of a gate array.

In the second embodiment, the electrostatic breakdown resistance can further be improved by arranging the normal diode-connected transistors parallel to transistors 61 and 62 operating as the above-described bi-directional diodes.

In the first and second embodiments, designing is provided with an electrostatic protection circuit using the transistors of output buffer transistor group 20. An input buffer can be designed using the transistor of output buffer transistor group 20, if necessary.

Also, the input buffer can be formed using the transistor of internal circuit transistor group 30.

In these cases, the electrostatic protection circuit provided between the input/output terminal and the input buffer can be designed using the transistor of output buffer transistor group 20. An input buffer corresponding to a desired current driving capability can be obtained without degrading the advantage in layout of the first and second embodiments.

Third Embodiment

In contrast to the first and second embodiments corresponding to a semiconductor integrated circuit device including an efficient electrostatic protection circuit directed to a plurality of independent power supply lines, the semiconductor integrated circuit device of the third embodiment includes an electrostatic protection circuit that can reliably implement a removal path effective for various type of surge.

Figure 16:
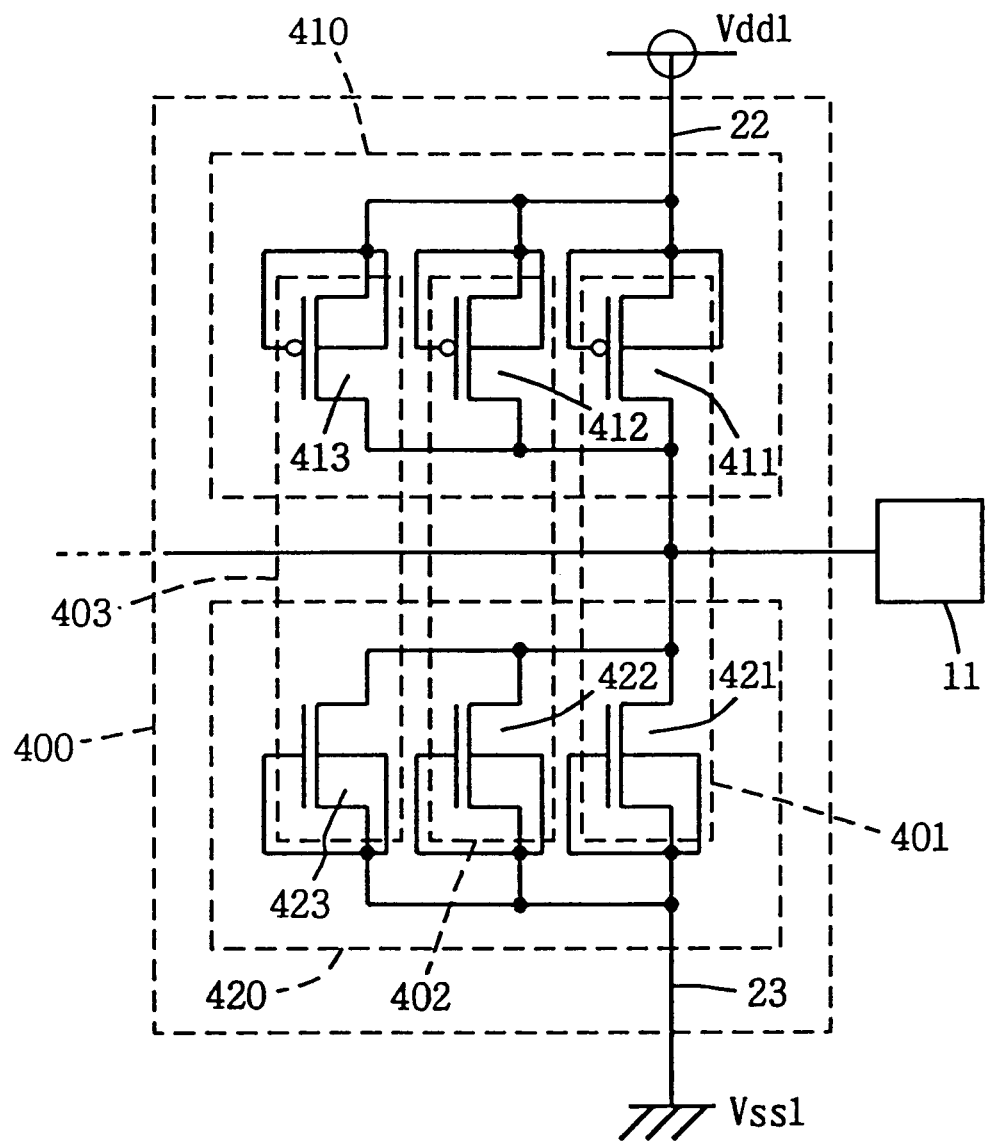
FIG. 16 shows a structure of an electrostatic protection circuit 400 of a semiconductor integrated circuit device according to a third embodiment of the present invention.

FIG. 16 shows a structure of an electrostatic protection circuit 400 in a semiconductor integrated circuit device according to the third embodiment of the present invention. Referring to FIG. 16, electrostatic protection circuit 400 includes a row of transistors 410 and a row of transistors 420 connected in parallel.

Transistor row 410 is connected between a power supply line 22 and a terminal 11, and corresponds to transistor 41 in electrostatic protection circuit 40 of the first and second embodiments. Similarly, transistor row 420 is connected between a ground line 23 and a terminal 11, and corresponds to transistor 42 in electrostatic protection circuit 40 of the first and second embodiments.

Transistor row 410 includes three P type transistors 411–413 connected in parallel. Each of P type transistors 411–413 is diode-connected, and is arranged parallel to each other between power supply line 22 and terminal 11.

Similarly, transistor row 420 includes three N type transistors 421–423 connected in parallel. Each of N type transistors 421–423 is diode-connected, and is arranged between ground line 23 and terminal 11 parallel to each other.

P type transistor 411 and N type transistor 421 belong to transistor subgroup 401. P type transistor 412 and N type transistor 422 belong to transistor subgroup 402. P type transistor 413 and N type transistor 423 belong to transistor subgroup 403.

The number of three transistors in transistor rows 410 and 420 is only a way of example. The number of transistors is not particularly limited to three.

Figure 17:
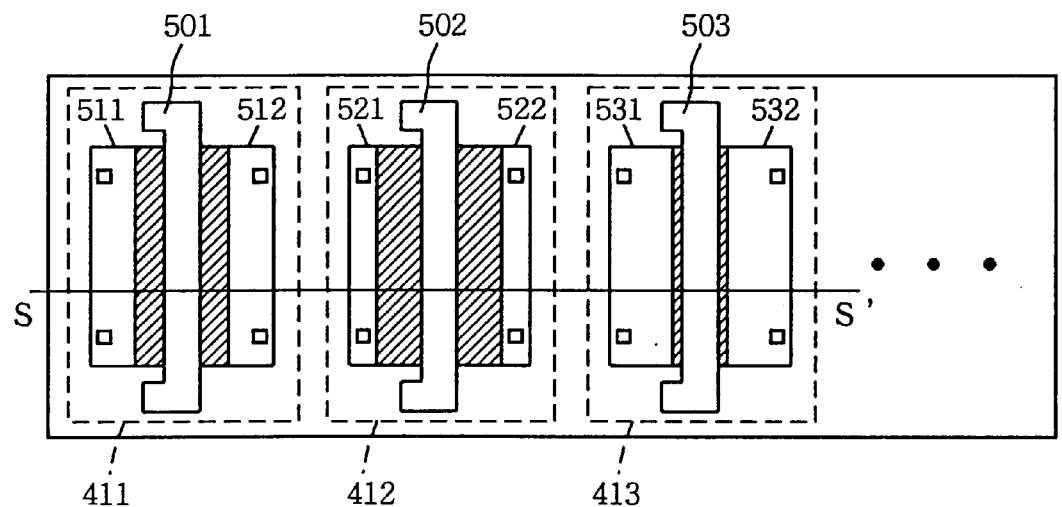
FIG. 17 is a schematic diagram to describe a structure of a P type transistor forming electrostatic protection circuit 400.

FIG. 17 is a schematic diagram to describe the structure of P type transistors 411–413. Referring to FIG. 17, P type transistor 411 includes a gate 501, a drain 511, and a source 512. A silicide coat film is formed at the electrode plane of drain 511 and source 512. The silicide protection technique is applied on the region that is hatched (this region is referred to as "silicide protection region" hereinafter). The structures of P type transistors 412 and 413 are basically similar, provided that the width of the silicide protection region formed in each of P type transistors 411–413 differs from each other. Thus, the width of the silicide protection region of transistors belonging to each transistor subgroup 401–403 differ from each other.

Figure 18:
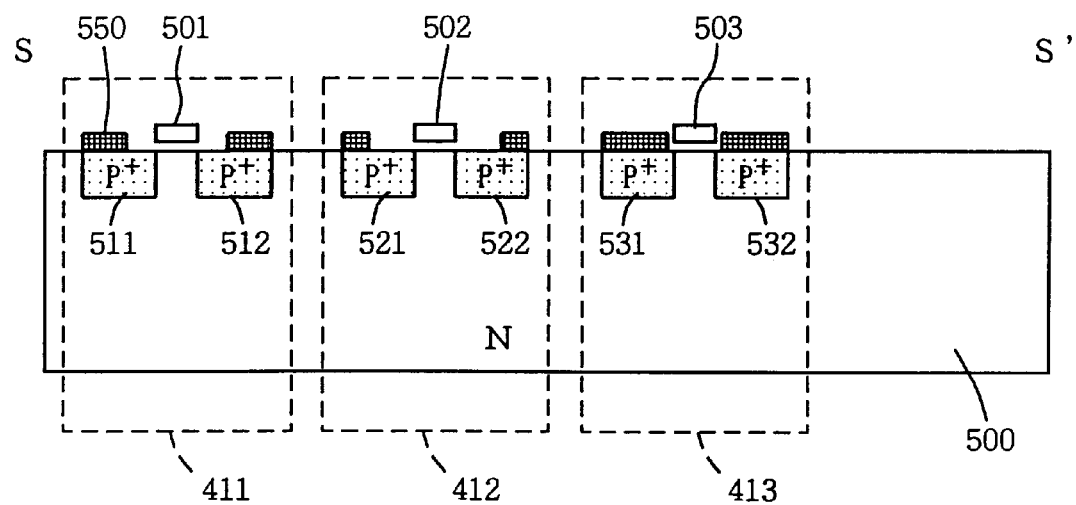
FIG. 18 is a schematic diagram taken along the cross section of S–S' of the structure of FIG. 17.

FIG. 18 is a schematic diagram taken along the cross section of S–S' of the structure of FIG. 17. Referring to FIG. 18, a region where a silicide film 550 is formed, and a region where silicide film 550 is not formed are present on the surface of the source and drain of each of transistors 411–413. The region where silicide film 550 is not formed corresponds to the hatched silicide protection region shown in FIG. 17.

The width of silicide film 550 formed on the surface of the source and drain in each of P type transistors 411–413 differs. Therefore, the electrode plane of the source and drain of each of transistors 411–413 has a different resistance.

The input resistance of the source and drain of respective transistors is set so that the resistance value of the surge removal path formed by the transistors accommodate the various types of surge.

More specifically, an optimum input resistance value is predesigned for each typical type of surge that is expected. A transistor having a silicide protection region of a corresponding width is fabricated. By a row of these transistors having a silicide protection region of a different width in parallel, an electrostatic protection circuit is formed.

Thus, a surge removal path accommodating the type of surge is formed within the electrostatic protection circuit.

Since, N type transistors 421–423 are designed similarly, the electrode plane of the source and drain of each of N type transistors 421–423 has a different resistance corresponding to each of P type transistors 411–413.

With a conventional design of transistors, an electrostatic protection effect can be obtained when various resistance elements are directly connected to the source or drain of the row of transistors connected in parallel. However, electrostatic protection circuit 400 of the third embodiment has the advantage of reducing the number of components and improving the layout efficiency.

Figure 19:
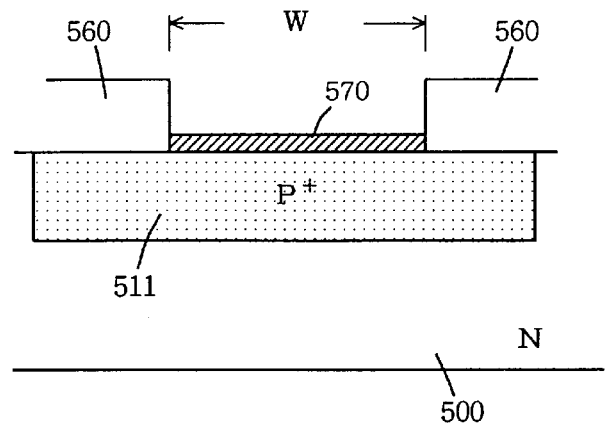
FIGS. 19 and 20 are schematic diagrams to describe specific examples in which the silicide protection region is variable.
Figure 20:
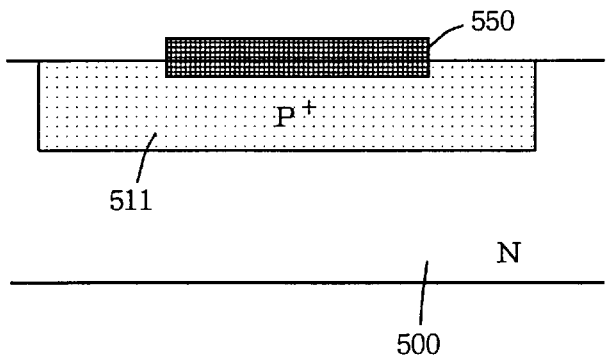

FIGS. 19 and 20 are diagrams to describe a specific example where the silicide protection region is variable. FIGS. 19 and 20 correspond to the case where a silicide film is formed on drain 511 of transistor 411.

Referring to FIG. 19, an insulation film 560 such as of silicon oxide is formed on the surface of a P+ region 511 which is the drain on substrate 500. Here, a region where an insulation film is formed and a region, which is W in width, where an insulation film is not formed are provided by the pattern design beforehand.

By carrying out annealing after refractory metal 570 such as Ti is deposited by sputtering, silicide film 550 is formed only on the plane indirect contact with the silicon, as shown in FIG. 20. More specifically, the region covered with insulation film 560 is subjected to silicide protection, and silicide film 550 is not formed.

By altering the setting of the width of W in forming the insulation film, a transistor having a silicide protection region of a different width, i.e., different input resistance of the source/drain can be obtained.

In the third embodiment, the electrostatic protection property is improved by connecting a plurality of transistors of different silicide protection region width in parallel to form electrostatic protection circuit 400 connected to terminal 11. However, the present invention is not limited to such an application. The electrostatic protection function for a plurality of independent power supplies can further be improved by applying the third embodiment to a protection circuit according to the first and second embodiments provided between a plurality of independent power supplies.

A similar effect can be achieved when the input buffer is formed by an internal circuit transistor group 30, by designing the transistors of the internal circuit transistor group 30 by the above-described methods and forming the protection circuit by connecting such transistors in parallel.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device formed on a semiconductor substrate, comprising:

a plurality of input/output terminals through which a signal is input/output with respect to an external source;

first and second power supply lines to supply a first power supply potential;

third and fourth power supply lines to supply a second power supply potential lower than said first power supply potential;

a first transistor group formed on a main surface of said semiconductor substrate, and receiving power supply potential from said first and third power supply lines, said first transistor group including a plurality of transistors forming an internal circuit that carries out a predetermined process according to a signal applied to said input/output terminals to output a corresponding data signal;

a second transistor group including a plurality of transistors formed on a main surface of said semiconductor substrate, receiving power supply potential from said second and fourth power supply lines, each transistor having the same transistor size, said second transistor group including a first transistor subgroup forming an output buffer provided between the input/output terminal from which said data signal is output out of said input/output terminals and said internal circuit, and that applies a buffer process on said data signal, a second transistor subgroup forming a first protection circuit protecting said output buffer and said internal circuit from a surge generated between said input/output terminal and any of said second and fourth power supply lines, and a third transistor subgroup forming a second protection circuit provided between said first power supply line and said second power supply line, and between said third power supply line and said fourth power supply line, to protect said internal circuit from a surge generated between said input/output terminal and any of said first and third power supply lines.

2. The semiconductor integrated circuit device according to claim 1, wherein said third transistor subgroup includes a plurality of transistors, each having a potential of a region right under the gate controlled independently.

3. The semiconductor integrated circuit device according to claim 2, wherein said first protection circuit comprises a first transistor provided between said input/output terminal and said second power supply line, operating as a diode with a direction from said input/output terminal towards said second power supply line as a forward direction, and a second transistor provided between said input/output terminal and said fourth power supply line, operating as a diode with a direction from said fourth power supply line towards said input/output terminal as a forward direction, wherein said second protection circuit comprises a third transistor provided between said first power supply line and said second power supply line, operating as a diode with a direction from said first power supply line towards said second power supply line as a forward direction, a fourth transistor operating as a diode with a direction from said second power supply line towards said first power supply line as a forward direction, a fifth transistor provided between said third power supply line and said fourth power supply line, operating as a diode with a direction from said third power supply line towards said fourth power supply line as a forward direction, and a sixth transistor operating as a diode with a direction from said fourth power supply line towards said third power supply line as a forward direction.

4. The semiconductor integrated circuit device according to claim 3, wherein said semiconductor substrate further comprises a semiconductor layer where said first and second transistor groups are formed, an insulation layer provided right under said semiconductor layer, and an oxide region for isolation, reaching said insulation layer from a main surface, provided to electrically isolate each transistor of said second transistor group.

5. The semiconductor integrated circuit device according to claim 3, wherein said semiconductor substrate is of a first conductivity type, and comprises a first well of the first conductivity type where said first and second transistor groups are formed, and a second well of a second conductivity type provided to electrically isolate each transistor of said second transistor group, formed so as to surround said first well excluding a main surface of said first well.

6. The semiconductor integrated circuit device according to claim 2, wherein said first protection circuit comprises a first transistor, and a second transistor, wherein said second protection circuit comprises a seventh transistor provided between said first power supply line and said second power supply line, operating as a bi-directional diode pair, said seventh transistor including a gate electrically coupled to one of a source and drain, and connected to said second power supply line, and a region right under a gate, electrically coupled to another of the source and drain, and connected to said first power supply line, an eighth transistor provided between said third power supply line and said fourth power supply line, operating as a bi-directional diode pair, said eighth transistor including a gate electrically coupled to one of a source and drain, and connected to said fourth power supply line, and a region right under a gate, electrically coupled to another of the source and drain, and connected to said third power supply line.

7. The semiconductor integrated circuit device according to claim 6, wherein said semiconductor substrate further comprises a semiconductor layer where said first and second transistor groups are formed, an insulation layer provided right under said semiconductor layer, and an oxide region for isolation, reaching said insulation layer from a main surface, and provided to electrically isolate each transistor of said second transistor group.

8. The semiconductor integrated circuit device according to claim 6, wherein said semiconductor substrate is of a first conductivity type, and comprises a first well of the first conductivity type where said first and second transistor groups are formed, and a second well of a second conductivity type provided to electrically isolate each transistor of said second transistor group, and formed to surround said first well excluding a main surface of said first well.

9. The semiconductor integrated circuit device according to claim 1, wherein said first protection circuit comprises a first transistor, and a second transistor, wherein said second protection circuit comprises a ninth transistor provided between said first power supply line and said second power supply line, and operating as a bi-directional diode pair, said ninth transistor including a gate electrically coupled to one of a source and drain, and connected to said first power supply line, a region right under a gate, electrically coupled to another of the source and drain, and connected to said second power supply line, and a tenth transistor provided between said third power supply line and said fourth power supply line, and operating as a bi-directional diode pair, said tenth transistor including a gate electrically coupled to one of a source and drain, and connected to said third power supply line, and a region right under a gate, electrically coupled to another of the source and drain, and connected to said fourth power supply line.

10. The semiconductor integrated circuit device according to claim 9, wherein each of said first and second transistors includes a gate electrically connected to one of a source and drain, and further electrically coupled to said region right under a gate.

11. A semiconductor integrated circuit device formed on a semiconductor substrate, comprising:

a plurality of input/output terminals through which a signal is input/output with respect to an external source;

first and second power supply lines for applying a first power supply potential;

third and fourth power supply lines for applying a second power supply potential lower than said first power supply potential;

a first transistor group formed on a main surface of said semiconductor substrate, and receiving power supply potential from said first and third power supply lines, said first transistor group including a plurality of transistors forming an internal circuit that carries out a predetermined process according to a signal applied to said input/output terminals to output a corresponding data signal, each transistor having the same size;

a second transistor group including a plurality of transistors formed on a main surface of said semiconductor substrate, receiving power supply potential from said second and fourth power supply lines, each transistor having the same transistor size, said second transistor group including a first transistor subgroup forming an output buffer provided between the input/output terminal from which said data signal is output out of said input/output terminals and said internal circuit, and that applies a buffer process on said data signal, a second transistor subgroup forming a first protection circuit protecting said output buffer and said internal circuit from a surge generated between said input/output terminal and any of said second and fourth power supply lines, and a third transistor subgroup forming a second protection circuit provided between said first power supply line and said second power supply line, and between said third power supply line and said fourth power supply line to protect said internal circuit from a surge generated between said input/output terminal and any of said first and third power supply lines.

12. The semiconductor integrated circuit device according to claim 11, wherein said third transistor subgroup includes a plurality of transistors, each having a potential of a region right under the gate controlled independently.

13. The semiconductor integrated circuit device according to claim 12, wherein said first protection circuit comprises a first transistor provided between said input/output terminal and said second power supply line, operating as a diode with a direction from said input/output terminal towards said second power supply line as a forward direction, and a second transistor provided between said input/output terminal and said fourth power supply line, operating as a diode with a direction from said fourth power supply line towards said input/output terminal as a forward direction, wherein said second protection circuit comprises a third transistor provided between said first power supply line and said second power supply line, operating as a diode with a direction from said first power supply line towards said second power supply line as a forward direction, a fourth transistor operating as a diode with a direction from said second power supply line towards said first power supply line as a forward direction, a fifth transistor provided between said third power supply line and said fourth power supply line, operating as a diode with a direction from said third power supply line towards said fourth power supply line as a forward direction, and a sixth transistor operating as a diode with a direction from said fourth power supply line towards said third power supply line as a forward direction.

14. The semiconductor integrated circuit device according to claim 12, wherein said first protection circuit comprises a first transistor, and a second transistor, wherein said second protection circuit comprises a seventh transistor provided between said first power supply line and said second power supply line, operating as a bi-directional diode pair, said seventh transistor including a gate electrically coupled to one of a source and drain, and connected to said second power supply line, and a region right under a gate, electrically coupled to another of the source and drain, and connected to said first power supply line, an eighth transistor provided between said third power supply line and said fourth power supply line, operating as a bi-directional diode pair, said eighth transistor including a gate electrically coupled to one of a source and drain, and connected to said fourth power supply line, and a region right under a gate, electrically coupled to another of the source and drain, and connected to said third power supply line.

15. The semiconductor integrated circuit device according to claim 11, wherein said first protection circuit comprises a first transistor, and a second transistor, wherein said second protection circuit comprises a ninth transistor provided between said first power supply line and said second power supply line, and operating as a bi-directional diode pair, said ninth transistor including a gate electrically coupled to one of a source and drain, and connected to said first power supply line, a region right under a gate, electrically coupled to another of the source and drain, and connected to said second power supply line, and a tenth transistor provided between said third power supply line and said fourth power supply line, and operating as a bi-directional diode pair, said tenth transistor including a gate electrically coupled to one of a source and drain, and connected to said third power supply line, and a region right under a gate, electrically coupled to another of the source and drain, and connected to said fourth power supply line.

16. The semiconductor integrated circuit device according to claim 15, wherein each of said first and second transistors includes a gate electrically connected to one of a source and drain, and further electrically coupled to said region right under a gate.

17. A semiconductor integrated circuit device formed on a semiconductor substrate, comprising:

a first power supply line to supply a first power supply potential;

a second power supply line to supply a second power supply potential lower than said first power supply potential;

a plurality of input/output terminals through which a signal is input/output with respect to an external source;

an electrostatic protection circuit removing a surge generated between said input/output terminals and any of said first and second power supply lines; and a transistor group formed on a main surface of said semiconductor substrate, receiving a power supply potential from said first and second power supply lines, said transistor group including a first plurality of transistor subgroups provided for said input/output terminals, a source/drain resistance of the transistor in each of said transistor subgroups being different from that in every other transistor subgroup, each of said transistor subgroups having
- a first transistor belonging to said electrostatic protection circuit and coupled between said first power supply line and a corresponding input/output terminal out of said input/output terminals, and
- a second transistor belonging to said electrostatic protection circuit and coupled between said second power supply line and said corresponding input/output terminal.

18. The semiconductor integrated circuit device according to claim 17, wherein each transistor in said transistor group has a region covered with a high conductive film on a source and drain region,
- wherein an area ratio of said region covered with a high conductive film to an entire plane of said source and drain is set for every said first plurality of transistor subgroups.

19. The semiconductor integrated circuit device according to claim 17, wherein said high conductive film is a compound of metal and silicon.

* * * * *